(12) United States Patent
Wall, Jr.

(10) Patent No.: US 7,759,144 B2
(45) Date of Patent: Jul. 20, 2010

(54) PACKAGE FOR A SEMICONDUCTOR LIGHT EMITTING DEVICE

(75) Inventor: Franklin J. Wall, Jr., Vacaville, CA (US)

(73) Assignees: Philips Lumileds Lighting Company LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/359,166

(22) Filed: Jan. 23, 2009

(65) Prior Publication Data

US 2009/0170226 A1 Jul. 2, 2009

Related U.S. Application Data

(62) Division of application No. 10/652,348, filed on Aug. 29, 2003, now Pat. No. 7,482,638.

(51) Int. Cl.
  H01L 21/00 (2006.01)
  H01L 21/50 (2006.01)
  H01L 21/48 (2006.01)
  H01L 21/44 (2006.01)
  H01L 29/22 (2006.01)
  H01L 27/15 (2006.01)
  H01L 29/267 (2006.01)
  H01L 23/52 (2006.01)

(52) U.S. Cl. .......................... 438/25; 438/22; 438/121; 438/122; 257/99; 257/79; 257/81; 257/782

(58) Field of Classification Search ................ 438/22, 438/25, 121, 122; 257/79, 81, 99, 782
See application file for complete search history.

(56) References Cited

U.S. PATENT DOCUMENTS

| 4,012,833 | A | 3/1977 | Akiyama |
| 4,566,170 | A | 1/1986 | Dolan |
| 4,735,866 | A | 4/1988 | Moorhead |
| 5,379,942 | A | 1/1995 | Kuhnert et al. |
| 5,924,191 | A | 7/1999 | Credle, Jr. et al. |
| 6,093,443 | A | 7/2000 | Schulz-Harder et al. |
| 6,274,924 | B1 | 8/2001 | Carey et al. |
| 6,333,522 | B1 | 12/2001 | Inoue et al. |
| 6,413,620 | B1 | 7/2002 | Kimura et al. |
| 6,480,389 | B1 | 11/2002 | Shie et al. |
| 6,486,499 | B1 | 11/2002 | Krames et al. |
| 6,498,355 | B1 | 12/2002 | Harrah et al. |
| 6,642,550 | B1 | 11/2003 | Whitworth et al. |
| 6,846,765 | B2 * | 1/2005 | Imamura et al. ........... 501/97.2 |
| 2002/0175339 | A1 | 11/2002 | Raj et al. |
| 2002/0179914 | A1 | 12/2002 | Sheu |
| 2003/0164503 | A1 | 9/2003 | Chen |
| 2004/0017005 | A1 | 1/2004 | Kobayashi et al. |

OTHER PUBLICATIONS

"LED Thermal Management", The Berquist Company, received Aug. 25, 2003.

(Continued)

*Primary Examiner*—Luan C Thai

(57) ABSTRACT

A semiconductor light emitting device package includes a substrate with a core and a copper layer overlying the core. The light emitting device is connected to the substrate directly or indirectly through a wiring substrate. The core of the substrate may be, for example, ceramic, $Al_2O_3$, AlN, alumina, silicon nitride, or a printed circuit board. The copper layer may be bonded to the core by a process such as direct bonding of copper or active metal brazing.

11 Claims, 5 Drawing Sheets

OTHER PUBLICATIONS

U.S. Appl. No. 10/632,719, filed Jul. 31, 2003, entitled: "Mount For Semiconductor Light Emitting Device", Inventors: Jerome C. Bhat, Cresente S. Elpedes, Paul S. Martin, Serge L. Rudaz, 24 pages.

Schulz-Harder, "Advantages and New Development of Direct Bonded Copper Substrates", Microelectronics Reliability, vol. 43, No. 3, Mar. 2003, pp. 359-365.

* cited by examiner

PACKAGE FOR A SEMICONDUCTOR LIGHT EMITTING DEVICE

CROSS-REFERENCE TO RELATED APPLICATIONS

The present application is a division of U.S. application Ser. No. 10/652,348, filed Aug. 29, 2003 and incorporated herein by reference.

BACKGROUND

1. Field of Invention

The present invention relates to a package for a semiconductor light emitting device and, in particular, to a package including a substrate with a thick copper layer.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. Often, an n-type region is deposited on the substrate, then an active region is deposited on the n-type region, then a p-type region is deposited on the active region. The order of the layers may be reversed such that the p-type region is adjacent to the substrate.

FIG. 1 illustrates a packaged semiconductor LED, described in more detail in U.S. Pat. No. 6,333,522. A III-nitride LED element 1 is formed on a transparent substrate 1a mounted face-down on a Si diode element 2 formed in a silicon substrate. Electrical connections between LED element 1 and diode element 2 are provided by gold microbumps 11 and 12 between a p-side electrode 5 of LED element 1 and an n-side electrode 8 of the Si diode element 2, and between an n-side electrode 6 of LED element 1 and a p-side electrode 7 of the Si diode element 2. The Si diode element 2 functions to protect LED element 1 from electrostatic discharge. The Si diode element 2 has a backside electrode 9 connected to a mount portion 15 of a lead frame 13a by a conductive paste 14. The p-side electrode 7 of the Si diode element 2 has a bonding pad portion 10 connected to a lead frame 13b by a gold wire bond 17. A transparent resin 18 covers LED element 1 and Si diode element 2.

The package illustrated in FIG. 1 has several disadvantages. The package of FIG. 1 does not efficiently conduct heat away from LED element 1. Heat is generated within the LED during regular operation. Light is generated in the LED by electrons from the n-type region recombining with holes from the p-type region. Some of this recombination is radiative, leading to the emission of photons. A sizeable fraction of the recombination may be non-radiative, generating heat instead of photons. In addition, some of the photons generated by radiative recombination are absorbed within the device, creating additional heat. In some devices, at least some of the heat generated within the device must be conducted away from the die to avoid damaging the LED. Neither resin 18 nor wire bond 17 conducts a significant amount of heat away from the LED. Thus, the only path conducting heat away from the device is lead 13a. The limited cross section and long length of lead 13a limits the amount of heat that can be eliminated from the LED through this path. The inability of the package of FIG. 1 to conduct heat away from LED element 1 can lead to hot spots and isolated device failures.

In addition, the package of FIG. 1 does not easily allow for multiple devices, such as multiple LED elements or chips containing other circuitry, to be connected to lead frames 13a and 13b.

Historically, LEDs have operated at low power, for example, less than 300 mW. The problems with the package of FIG. 1 become severe design limitations as newer generations of LEDs are planned to be operated at higher power, for example, 1 W to 500 W, and in higher temperature environments, leading to an increase in operating temperatures and heat production.

SUMMARY

According to embodiments of the invention, a semiconductor light emitting device package includes a substrate with a core and a copper layer overlying the core. The light emitting device is connected to the substrate directly or indirectly through a wiring substrate. The core of the substrate may be, for example, ceramic, $Al_2O_3$, AlN, alumina, or silicon nitride. The copper layer may be bonded to the core by a process such as direct bonding of copper or active metal brazing.

The materials used in the package may be chosen to efficiently remove heat from the light emitting device, to have an insulating layer to facilitate mounting and connection of multiple chips, and to closely match the coefficient of thermal expansion (CTE) of the light emitting device and any intervening structure.

DETAILED DESCRIPTION

According to embodiments of the invention, a semiconductor light emitting device is mounted, directly or indirectly, on a substrate including a copper layer. The substrate may be chosen (1) to efficiently remove heat from the light emitting device, (2) to facilitate mounting and connection of multiple chips, and (3) to closely match the coefficient of thermal expansion (CTE) of the light emitting device and any intervening structure.

Figure 2:
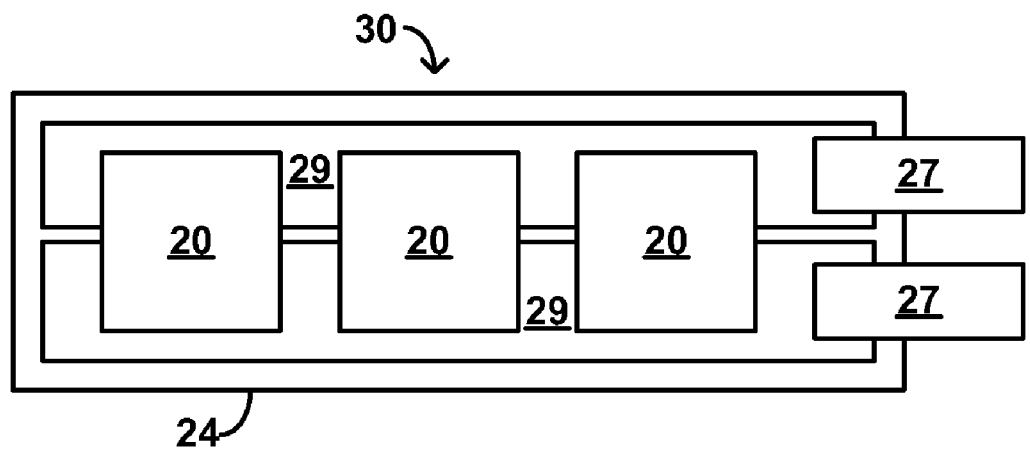
FIG. 2 is a plan view of an embodiment of the present invention.
Figure 3:
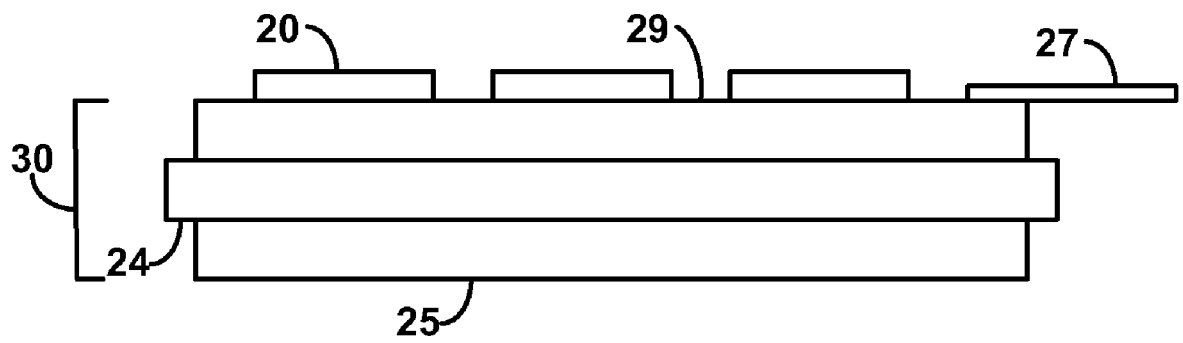
FIG. 3 is a cross sectional view of the package illustrated in FIG. 2.

FIGS. 2 and 3 are a plan view and a cross sectional view of an embodiment of the invention. Semiconductor light emitting devices 20 are mounted on a substrate 30 including a thick copper layer (hereinafter referred to as a "copper substrate").

Copper substrate 30 includes an insulating core 24 and one or more thick regions of the metal 25 and 29. Core layer 24 and metal regions 25 and 29 are selected such that the composite of core layer 24 and metal regions 25 and 29 has a coefficient of thermal expansion matched to LED 20 and to have high thermal conductivity. Core 24 may be, for example, ceramic, $Al_2O_3$, AlN, alumina, or silicon nitride. Metal regions 25 and 29 are often copper, but may be any suitable metal. Metal regions 25 and 29 are thick enough to efficiently conduct heat laterally, generally about 4 mils (101.6 μm) to about 24 mils (609.6 μm). Multiple metal regions 29 formed on the side of copper substrate 30 on which the LEDs are mounted electrically connect leads 27 to the LEDs. These metal regions 29 are electrically isolated from each other by core 24. Though two metal regions 29 are illustrated in FIG. 2, more metal regions and more leads 27 may be provided where additional devices are provided on copper substrate 30. Metal region 25 on the opposite side of copper substrate 30 usually does not provide electrical connections and is thus an uninterrupted layer of metal.

Metal layers 25 and 29 may be bonded to core layer 24 by processes known in the art such as direct bonding of copper (DBC) and active metal brazing (AMB). In a preferred embodiment, copper substrate 30 is a DBC substrate. DBC substrates are made by oxidizing a sheet of copper foil, then placing the foil on core layer 24 to form a composite substrate. The composite substrate is heated to a process temperature between about 1065° C. and 1083° C. to form a eutectic melt that creates a continuous, uniform bond between the core and the metal layer, then cooled to room temperature. The copper on the substrate may be lithographically patterned to form different regions. DBC substrates described in more detail in U.S. Pat. Nos. 6,093,443 and 5,924,191, both of which are incorporated herein by reference. DBC substrates are available from Curamik Electronics of Germany. DBC substrates offer excellent thermal conductivity and coefficients of thermal expansion closely matched to III-nitride LEDs. For example, a semiconductor light emitting device may have a coefficient of thermal expansion of about 5 ppm/K. A $Cu/Al_2O_3/Cu$ DBC may have a thermal conductivity of about 24 W/m·K and a coefficient of thermal expansion of about 7.3 ppm/K. A Cu/AlN/Cu DBC substrate may have a thermal conductivity of about 180 W/m·K and a coefficient of thermal expansion of about 5.1 ppm/K. In contrast, a standard metal core printed circuit board (MCPCB) with thin copper traces bonded to a dielectric layer with epoxy, then bonded to an aluminum layer with epoxy may have a thermal conductivity of only 2-5 W/m·K and a coefficient of thermal expansion of 25-30 ppm/K. In addition, DBC substrates may be processed and may operate at temperatures up to about 800° C., in contrast to standard MCPCBs which can tolerate process temperatures up to only 250° C. and can be operated at temperatures up to only 140° C.

AMB substrates are formed by using a layer of braze to bond thick copper regions 25 and 29 to core 24, rather than the direct bond of a DBC substrate. Suitable AMB substrates with an AlN core are available from Toshiba.

Light emitting devices 20 of FIGS. 2 and 3 are usually high power devices, i.e. devices having an area greater than about 400×400 $\mu m^2$ and capable of operating at a current density of at least 50 $A/cm^2$. A common size for a high power device is an area greater than or equal to 1×1 $mm^2$ and electrical power consumption greater than or equal to 1 W. Though the devices illustrated in FIGS. 2 and 3 are flip chips, i.e. mounted with both contacts on the same side of the device and facing copper substrate 30 such that light is extracted through the side of the device opposite the contacts, other configurations are possible and within the scope of the invention. For example, rather than being mounted over two metal regions 29, LEDs 20 of FIGS. 2 and 3 may be mounted over a single metal region 29 with wire bonds connecting a second contact on the LEDs to a second metal region 29 on copper substrate 30. A device suitable for wire bonding may be, for example, a III-nitride device formed on a conducting SiC substrate.

Figure 4:
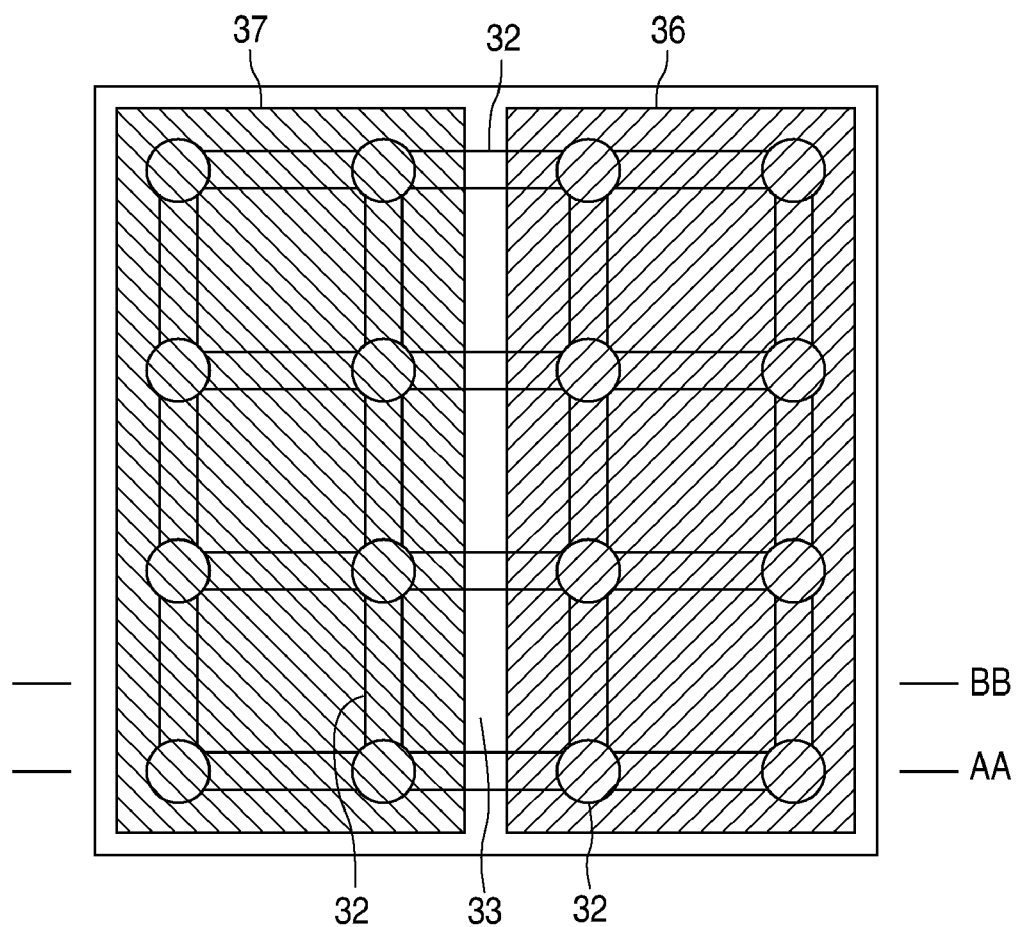
FIGS. 4, 5, and 6 are a plan view and two cross sectional views of a semiconductor light emitting device.
Figure 5:
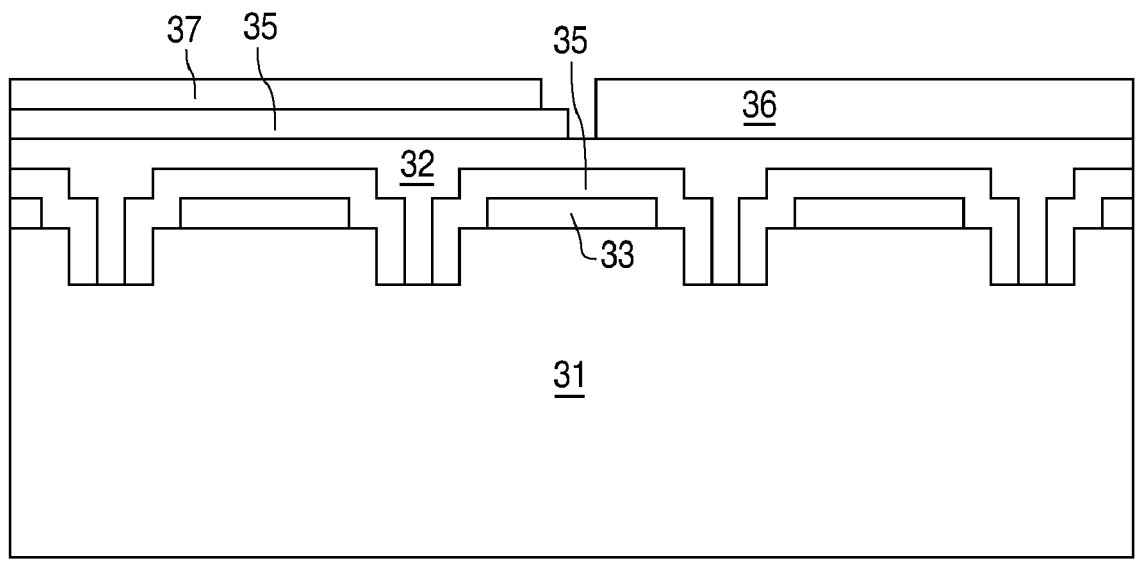
Figure 6:
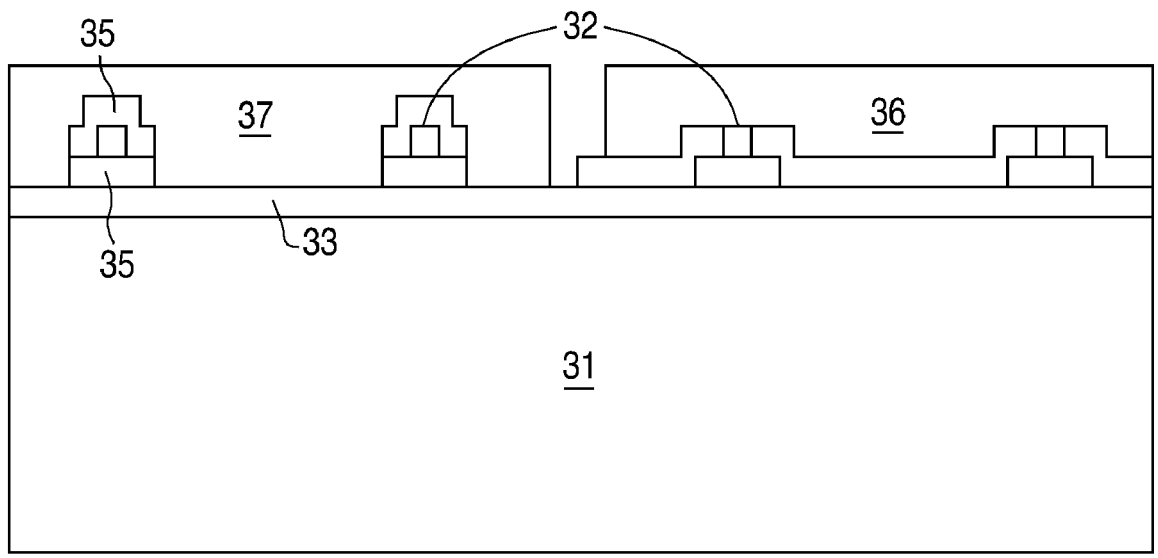

An example of a high power semiconductor light emitting device suitable for use with the package of FIGS. 2 and 3 is illustrated in FIGS. 4-6. The device of FIGS. 4-6 is described in more detail in application Ser. No. 10/172,311, filed Jun. 13, 2002 and incorporated herein by reference. FIG. 4 is a plan view; FIG. 5 is a cross sectional view along axis AA of FIG. 4; and FIG. 6 is a cross sectional view along axis BB of FIG. 4. The semiconductor layers 31 of the device of FIGS. 4-6 may be III-nitride layers grown on a transparent substrate, such as SiC or sapphire (not shown). Usually, layers 31 include an n-type region formed over the substrate, an active region formed over the n-type region, and a p-type region formed over the active region. Portions of the active and p-type regions are etched away to expose portions of the n-type region on which n-contacts 32 are formed.

In the device of FIGS. 4-6, contact to the n-side of the device is made by a plurality of holes etched down to the n-type region of the device. The holes are connected by a series of interconnects formed over and electrically isolated from the p-contacts 33. FIG. 4 illustrates 16 n-contact holes, enclosing nine p-contact regions. P-contacts 33 are isolated from n-contacts 32 by one or more dielectric layers 35. On the left hand side of the device of FIG. 4, the top dielectric layers are patterned to expose p-contacts 33, but not n-contacts 32. A p-interconnect region 37 is then deposited over the left hand side of the device. On the right hand side, the top dielectric layers are patterned to expose n-contacts 32, but not p-contacts 33. An n-interconnect region 36 is then deposited over the right hand side of the device. Interconnect regions 36 and 37 facilitate contact between LED 20 and copper substrate 30. If the LED is solder-mounted to copper substrate 30, interconnect regions 36 and 37 may be, for example, solderable metals. In the device of FIGS. 4-6, the shape and placement of interconnect regions 36 and 37 is arbitrary with respect to the shape and placement of underlying contacts 32 and 33. Thus, interconnect regions 36 and 37 can be made large enough and far enough apart to permit direct connection to copper substrate 30.

Leads 27, if used, may be connected metal regions 29 on copper substrate 30. Leads 27 may be straight, as shown, or formed for stress relief. The material used to form leads 27 may be thermally resistive, to facilitate soldering, spot welding, and attaching a slip-on connector to the leads. Other methods besides leads may be used to electrically and physically attach copper substrate 30 to another device. For example, in place of leads 27, solder pads, wire bonds, or terminated wires may be formed on metal regions 29. In general, leads or some other method of connecting copper substrate 30 to another device are used rather than directly connecting the device to one of the metal regions on copper substrate 30, because copper substrate 30 so efficiently conducts heat that it can be difficult to heat the metal regions of copper substrate 30 enough to wet a direct connector such as solder to the surface.

Figure 7:
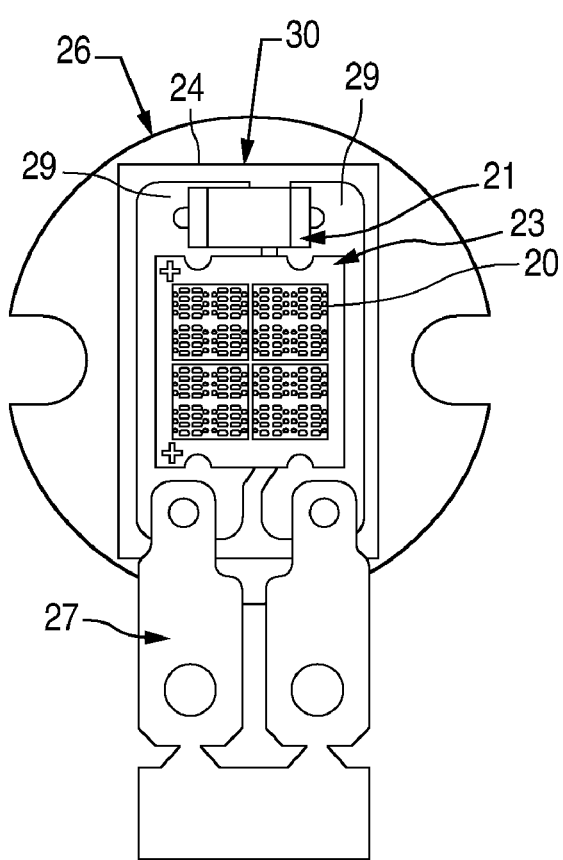
FIG. 7 is a plan view of an alternative embodiment of the present invention.
Figure 8:
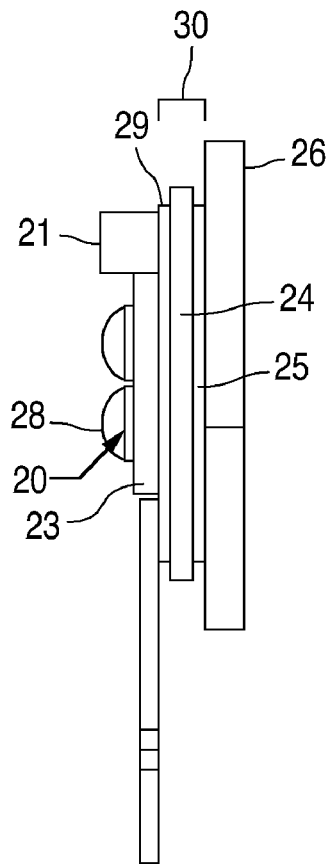
FIG. 8 is a cross sectional view of the package of FIG. 7.

FIGS. 7 and 8 illustrate an alternative embodiment of the present invention. In the package of FIGS. 7 and 8, semiconductor light emitting devices 20 are mounted on an optional wiring substrate 23, rather than directly on copper substrate 30. Wiring substrate 23 and any other devices 21 included in the design (such as an electrostatic discharge protection diode) are then mounted on copper substrate 30. Wiring substrate 23 may be used when the interconnect regions on LEDs 20 are sized, shaped, or placed in a manner that make direct connection to copper substrate impractical or impossible. An example of an LED with such interconnect regions is illustrated in FIGS. 9 and 10.

Figure 9:
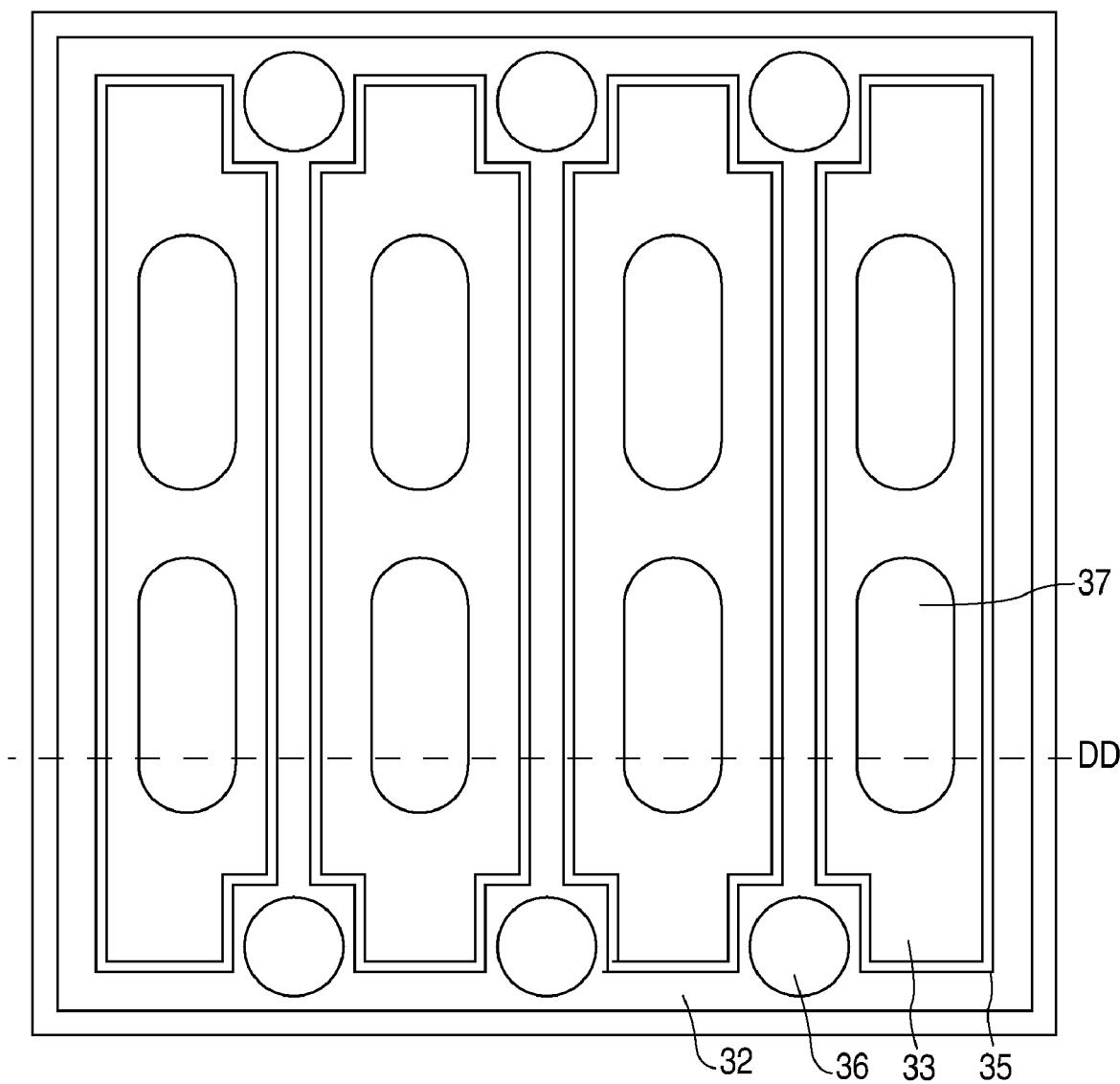
FIGS. 9 and 10 are a plan view and a cross sectional view of a semiconductor light emitting device.
Figure 10:
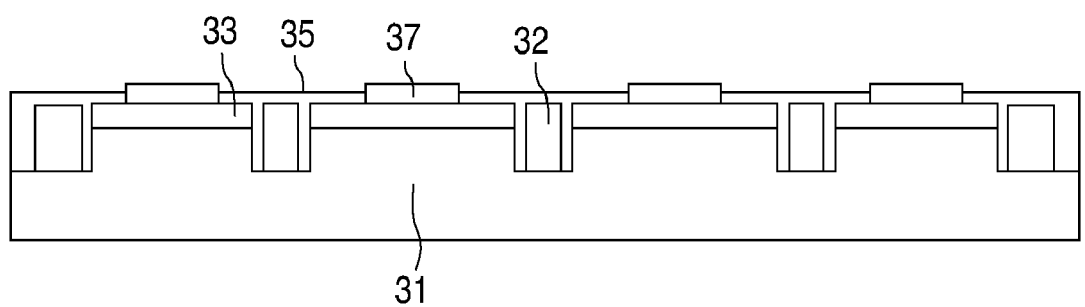

FIG. 9 is a plan view and FIG. 10 is a cross sectional view along line DD of FIG. 9. N-contact 32 is a single, continuous contact dividing the active region into four segments. P-contacts 33 are formed on the remaining portions of the p-type region. The n- and p-contacts are electrically isolated by air or an optional dielectric layer 35. N-interconnect regions 36 and p-interconnect regions 37 are formed on n-contacts 32 and p-contacts 33.

In the LED embodiment illustrated in FIGS. 9 and 10, the interconnect regions correspond to the underlying contacts and must therefore be fairly small and carefully spaced. The size and spacing of interconnect regions 36 and 37 make it impractical to directly bond LED 20 to copper substrate 30, because it is difficult to form copper features of the size and spacing required by the device of FIGS. 9 and 10 that are thick enough to have favorable heat spreading characteristics. Thus, LED 20 of FIGS. 9 and 10 is mounted on wiring substrate 23.

The primary function of wiring substrate 23 is to provide electrical connection between LED 20 and copper substrate 30. Wiring substrate 23 may be, for example, a metal/ceramic composite wiring substrate as described in U.S. Pat. No. 6,413,620, which is incorporated herein by reference. The ceramic may be, for example, AlN or alumina, silicon nitride and the metal may be, for example tungsten or molybdenum. Suitable wiring substrates are available from Kyocera Corporation of Kyoto, Japan. Wiring substrate 23 may be formed with interconnect regions small enough to accommodate bonding to the interconnect regions of the device illustrated in FIGS. 9 and 10. Multiple LEDs, fabricated either on the same growth substrate or on separate growth substrates, may be mounted on and electrically connected by wiring substrate, as illustrated in FIG. 7, which shows interconnect regions for 16 of the devices illustrated in FIGS. 9 and 10 formed on four substrates. The materials in wiring substrate 23 are selected to be CTE matched to LED 20 and copper substrate 30, and to have high thermal conductivity to conduct heat away from LED 20. In embodiments where wiring substrate 23 is a metal/ceramic substrate, circuitry such as electrostatic discharge protection circuitry or power conditioning circuitry usually cannot be formed within wiring substrate 23 and is provided as separate chips 21, mounted either on wiring substrate 23 or directly on copper substrate 30. In some embodiments, wiring substrate 23 is a silicon integrated circuit including any required circuitry.

In some embodiments, copper substrate 30 is connected to a base 26, which is used to connect copper substrate 30 to a heat sink or other device. The base shown in FIG. 7 has two notches that facilitate bolting or riveting base 26 to a heat sink, though solder or any other suitable technique may be used to attach base 26 to a heat sink. Usually, an interface material is disposed between base 26 and the heat sink on which base 26 is mounted, to channel heat from base 26 to the heat sink. Examples of such materials are thermal grease, phase change tape, solder, or a thermal blanket. The interface materials are typically poor thermal conductors. To improve the thermal performance of the interface and to facilitate bolting base 26 to the heat sink, the footprint of base 26 is often larger than copper substrate 30. As the amount of heat that must channeled away from the LEDs increases, for example as the wattage applied to the LEDs increases, the size of the footprint of base will also increase. The size of the footprint of the base can be selected to prevent the LEDs from exceeding a given maximum temperature.

In some embodiments, other devices 21 besides LEDs 20, such as a device including electrostatic discharge protection circuitry, may be attached to copper substrate 30 or wiring substrate 23. In some embodiments, a lens 28 is formed over LED 20. Lens 28 may be, for example, a high index optical material bonded to LED 20, to wiring substrate 23, or to copper substrate 30. Alternatively, lens 28 may be a hard or soft silicone lens or a hard epoxy or other clear plastic lens molded over LED 20. In some embodiments, a hard or soft silicone lens is coupled to one or more LEDs with a soft silicone gel or other optically transparent materials. In the embodiment illustrated in FIG. 8, a lens is formed over each LED chip. In the device illustrated in FIGS. 7 and 8, each LED chip includes four individual LEDs. Alternatively, a lens may be formed or attached to each LED device, or a single lens may be formed or attached to all the LEDs in the device. Since hard plastic materials such as epoxy tend to have CTEs vastly different from LEDs (for example, 50-60 ppm/K for plastic vs. 5 ppm/K for a semiconductor device), a lens formed over all the LEDs in the device must usually be formed from a soft, flexible material, such as a silicone material. If the lens is formed over an individual chip or an individual device, hard materials such as epoxy may be used.

The packaged devices illustrated in FIGS. 2 and 3 or 7 and 8 may be assembled as follows. First, if a wiring substrate 23 is used, LED 20 is electrically and physically connected to wiring substrate 23 by any suitable bonding material including, for example, solder, elemental metals, metal alloys, semiconductor-metal alloys, thermally and electrically conductive pastes or compounds, eutectic joints, and gold stud-bumps. A lens 28 that is directly bonded to LED 20 may be mounted on LED 20 before LED 20 is connected to wiring substrate 23. Leads 27 and optional base 26 are then brazed to copper substrate 30, usually at a temperature of about 800° C. and in an atmosphere of nitrogen, rather than hydrogen or a mixture of hydrogen and nitrogen, to avoid damaging the oxide bond between the metal regions and the core of copper substrate 30. Finally, wiring substrate 23, or LED 20 if no wiring substrate is used, and any other required devices 21 are electrically and physically connected to copper substrate 30 by, for example, solder.

Figure 1:
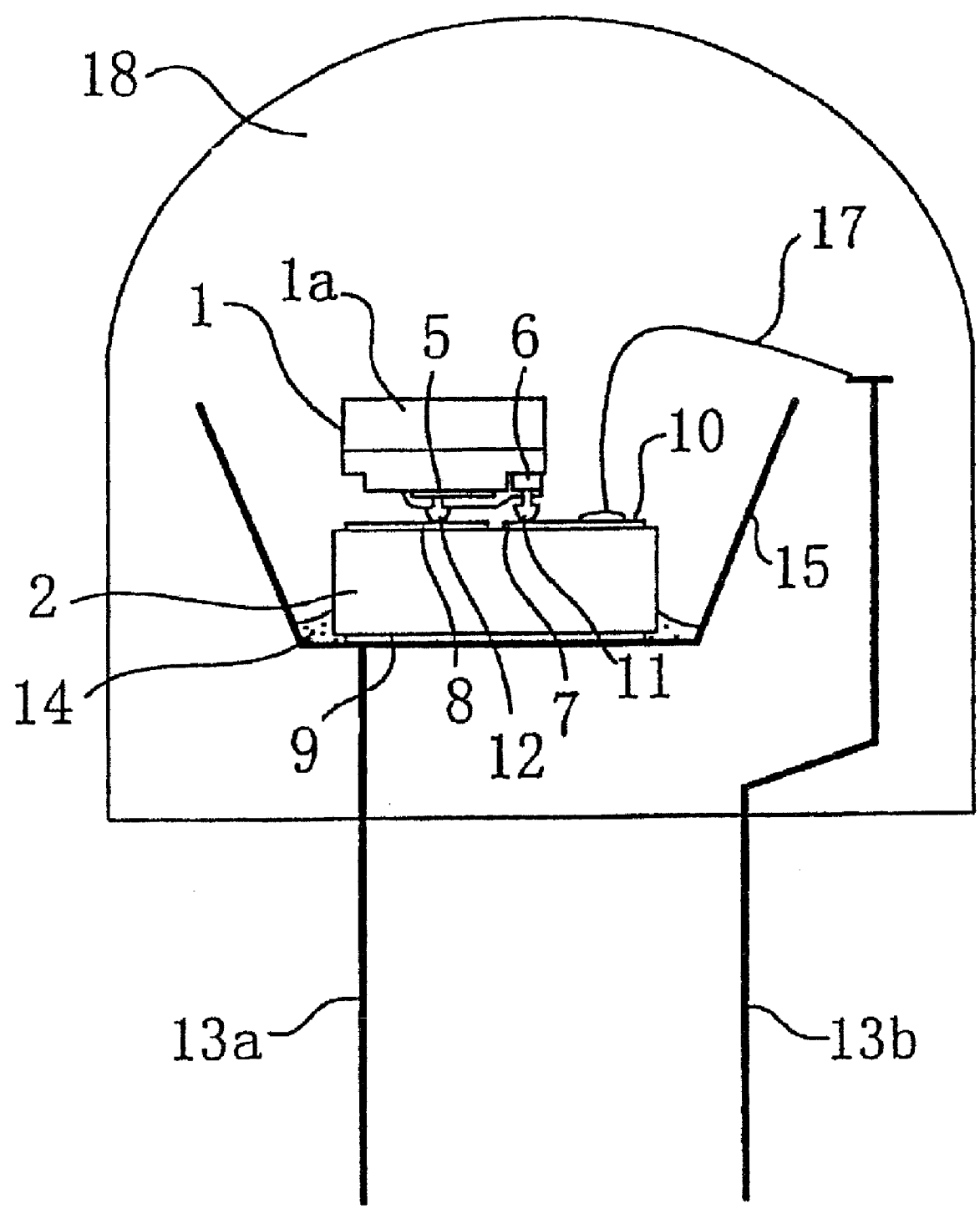
FIG. 1 illustrates a light emitting diode mounted on a silicon diode element and wire bonded to a lead frame, according to the prior art.

The use of a substrate including a thick copper layer in a semiconductor light emitting device package may offer several advantages. First, the packages illustrated in FIGS. 2, 3, 7 and 8 use highly thermally conductive materials, allowing the package to efficiently conduct heat away from LEDs 20. Also, unlike the package illustrated in FIG. 1 which only spreads heat vertically through lead 13a, the package designs of FIGS. 2, 3, 7 and 8 spread heat laterally in metal regions 29, and vertically through metal regions 29, core 24, and metal region 25. Laterally spreading the heat eliminates hot spots that may damage LEDs 20. The ability to efficiently channel heat away from LEDs 20 potentially permits higher current density operation without the risk of damage to the LEDs. In addition, all the elements of the package of FIGS. 2, 3, 7 and 8 have closely matched coefficients of thermal expansion, potentially allowing higher temperature operation without the risk of damage to the LEDs. Further, insulating core 24 of copper substrate 30 permits electrical isolation of different metal regions 29, allowing multiple devices to be incorporated on a single substrate.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of packaging a semiconductor light emitting device, the method comprising:
   providing a substrate having a thermal conductivity of at least 24 W/m·K, the substrate comprising a ceramic core and at least one copper layer, the at least one copper layer having a thickness of at least 4 mils; and
   electrically connecting a semiconductor light emitting device to at least one of the copper layers.

2. The method of claim 1 further comprising attaching at least one lead to the at least one copper layer.

3. The method of claim 1 wherein the substrate is a first substrate, the method further comprising:
   mounting the semiconductor light emitting device on a second substrate; and
   after mounting the semiconductor light emitting device on the second substrate, mounting the second substrate on the first substrate.

4. The method of claim 1 further comprising:
   providing a lens over the semiconductor light emitting device.

5. The method of claim 1 further comprising bonding the copper layer to the core by:
   forming an oxide coating on a sheet of copper;
   placing the oxide coating adjacent to the core; and
   heating the oxide coating to form a eutectic melt.

6. The method of claim 1 further comprising connecting the substrate to a base.

7. The method of claim 6 further comprising attaching the base to a heat sink.

8. The method of claim 7 further comprising disposing a material between the heat sink and the base.

9. The method of claim 8 wherein the material is one of grease, phase change tape, solder, and a thermal blanket.

10. The method of claim 1 further comprising attaching a device comprising electrostatic discharge protection circuitry to the substrate.

11. The method of claim 3 further comprising attaching a device comprising electrostatic discharge protection circuitry to the second substrate.

* * * * *